(12) United States Patent
Jiang et al.

(10) Patent No.: US 7,348,777 B2
(45) Date of Patent: Mar. 25, 2008

(54) THERMAL SHIELD TO COLDHEAD SLEEVE THERMAL CONTACT

(75) Inventors: Longzhi Jiang, Florence, SC (US); Gregory Alan Lehmann, Florence, SC (US); Clifford Joseph Ginfrida, Florence, SC (US)

(73) Assignee: General Electric Company, Schenectady, NY (US)

( * ) Notice: Subject to any disclaimer, the term of this patent is extended or adjusted under 35 U.S.C. 154(b) by 257 days.

(21) Appl. No.: 10/708,979

(22) Filed: Apr. 5, 2004

(65) Prior Publication Data
US 2005/0228262 A1     Oct. 13, 2005

(51) Int. Cl.
*G01V 3/00*     (2006.01)
(52) U.S. Cl. .................................................... 324/318
(58) Field of Classification Search ......... 324/230–322
See application file for complete search history.

(56) References Cited

U.S. PATENT DOCUMENTS

| | | | | |
|---|---|---|---|---|
| 5,304,934 A | * | 4/1994 | Laskaris et al. ............. 324/318 |
| 5,317,879 A | * | 6/1994 | Goldberg et al. ............. 62/51.1 |
| 5,563,566 A | * | 10/1996 | Laskaris et al. ............. 335/216 |
| 5,864,273 A | * | 1/1999 | Dean et al. ................. 335/216 |
| 6,181,228 B1 | * | 1/2001 | Laskaris et al. ............. 335/300 |
| 6,246,308 B1 | * | 6/2001 | Laskaris et al. ............. 335/216 |

* cited by examiner

*Primary Examiner*—Brij Shrivastav
*Assistant Examiner*—Dixomara Vargas
(74) *Attorney, Agent, or Firm*—Peter Vogel

(57) ABSTRACT

A magnetic resonance imaging magnet assembly is provided. The assembly comprises a outer thermal shield having an operational temperature. The assembly further includes a cold sleeve assembly comprising a plurality of braid elements mounted to a cooler block and a highly thermally conductive block mounted between the cooler block and the outer thermal shield. The highly thermally conductive block is welded to the outer thermal shield and is welded to the cooler block. The highly thermally conductive block has greater thermal conductance than the outer thermal shield.

18 Claims, 1 Drawing Sheet

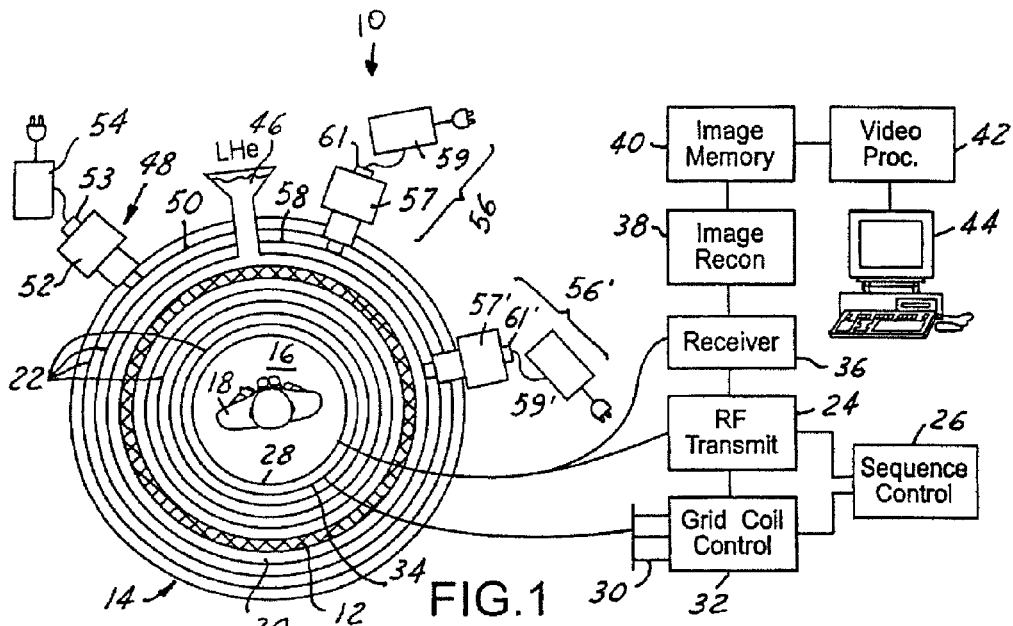
FIG.1
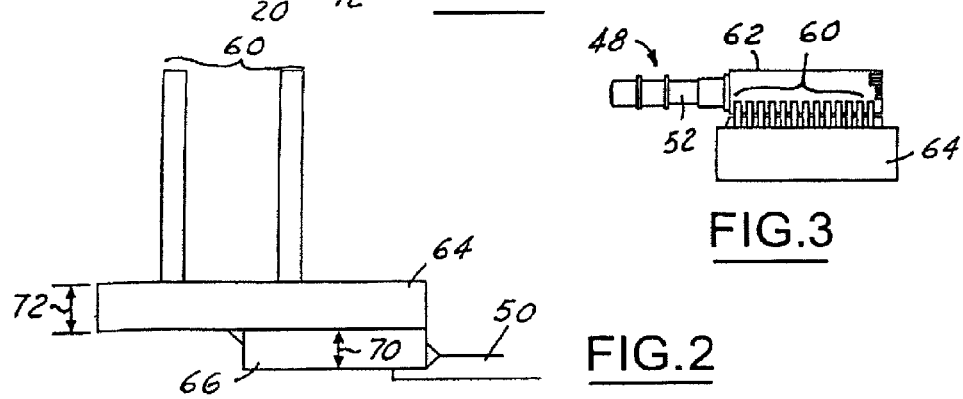
FIG.2
FIG.3
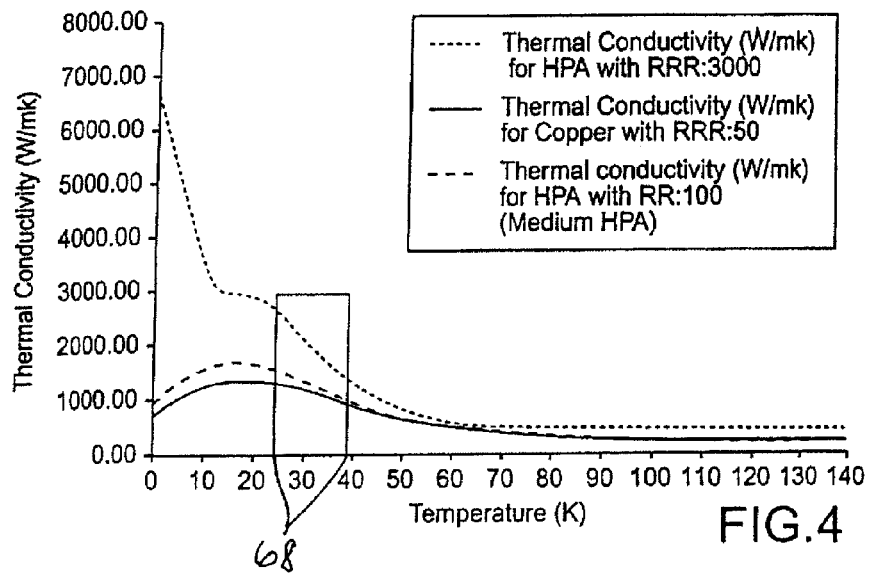
FIG.4

THERMAL SHIELD TO COLDHEAD SLEEVE THERMAL CONTACT

BACKGROUND OF INVENTION

The present invention relates generally to a magnetic resonance imaging assembly, and, more particularly to a cold head sleeve mounting assembly for use in a magnetic resonance imaging assembly.

Magnetic Resonance Imaging (MRI) is a well-known medical procedure for obtaining detailed, one, two and three-dimensional images of patients, using the methodology of nuclear magnetic resonance (NMR). MRI is well suited to the visualization of soft tissues and is primarily used for diagnosing disease pathologies and internal injuries.

Typical MRI systems include a superconducting magnet capable of producing a strong, homogenous magnetic field around a patient or portion of the patient; a radio frequency (RF) transmitter and receiver system, including transmitter and receiver coils, also surrounding or impinging upon a portion of the patient; a gradient coil system also surrounding a portion of the patient; and a computer processing/imaging system, receiving the signals from the receiver coil and processing the signals into interpretable data, such as visual images.

The superconducting magnet is used in conjunction with a gradient coil assembly, which is temporally pulsed to generate a sequence of controlled gradients in the main magnetic field during a MRI data gathering sequence. Inasmuch as the main superconducting magnet produces a homogeneous field, no spatial property varies from location to location within the space bathed by such field; therefore, no spatial information, particularly pertaining to an image, can be extracted therefrom, save by the introduction of ancillary means for causing spatial (and temporal) variations in the field strength. This function is fulfilled by the above-mentioned gradient coil assembly; and it is by this means of manipulating the gradient fields that spatial information is typically encoded.

Superconducting magnets operate under extremely low temperatures. This is commonly accomplished through the use of cryogens such as liquid helium. The cryogens must often be stored and delivered under low temperatures in order to deliver the proper efficiency. Cryogens such as liquid helium, however, are not abundant and therefore can significantly impact the cost of operation of the MRI system. In addition, exposure of liquid helium to room temperature magnets can result in the boiling of the liquid helium, which negatively impacts the performance and efficiency of the MRI system.

The result has been the development of low helium boil-off and zero helium boil-off MRI magnet designs. These designs commonly utilized single, dual or three stage cryocooler assemblies to cool the MRI superconducting magnet to a temperature where the low/no boil-off requirement can be met. With dual-stage cryocooler assemblies a first stage cold head cools down the radiation thermal shield while the second stage cold head either cools down the second radiation shield in low boil-off cryostat designs or recondenses the gas helium to liquid helium in zero helium boil-off designs. The cold head assemblies must be mounted to the thermal shields or the helium vessel in order to provide a thermal path away from the MRI system.

One approach to mounting the cold head sleeve assemblies has been to bolt the cold head sleeve assemblies to a mounting surface positioned on the aluminum surface of the radiation thermal shield. A gasket, such as an indium gasket, is placed in between the cold head sleeve assembly and the mounting surface in order to insure proper thermal contact between the cold head sleeve assembly and the thermal outer shield. This present design has several drawbacks. The indium gasket and the mounting surface (commonly 6061 aluminum) act as a thermal resistor for thermal contact between the radiation thermal shield and the cold head sleeve assembly. This can result in large temperature gradients between the cold head sleeve assembly and the outer thermal shield. These temperature gradients can be further exacerbated by the nature of assembly of the cold head sleeve to the mounting surface. When such elements are joined by bolting (as commonly done) the thermal resistance can depend on the torque applied to the bolts. Finally, the cost of the indium or similar gaskets can adversely affect the cost effectiveness of these existing systems.

It would, however, be highly desirable to have an apparatus and method for attaching the cold head sleeve assembly to the outer thermal shield that reduced the thermal resistance and subsequent temperature gradients between the cold head sleeve assembly and the outer thermal shield. Similarly, it would be highly desirable to have a magnetic resonance imaging magnet assembly that could be manufactured without inefficient and costly gaskets positioned between the cold head sleeve assembly and the outer thermal shield.

SUMMARY OF INVENTION

A magnetic resonance imaging assembly is provided. The assembly comprises a outer thermal shield having an operational temperature. The assembly further includes a cold head sleeve assembly comprising a plurality of braid elements mounted to a cooler block and a highly thermally conductive block mounted between the cooler block and the outer thermal shield. The highly thermally conductive block is welded to the outer thermal shield and is welded to the cooler block. The highly thermally conductive block has greater thermal conductance than the outer thermal shield.

Other features of the present invention will become apparent when viewed in light of the detailed description of the preferred embodiment when taken in conjunction with the attached drawings and appended claims.

BRIEF DESCRIPTION OF DRAWINGS

FIG. 1 is an illustration of a magnetic resonance imaging assembly in accordance with the present invention;

FIG. 2 a detailed view of a cold head sleeve assembly and a thermal shield as illustrated in FIG. 1, the detail illustrating the mounting technique in accordance with the present invention;

FIG. 3 is a detailed illustration of the cold head sleeve assembly illustrated in FIG. 1; and FIG. 4 is a graph of thermal conductivity vs. temperature for copper, high purity aluminum, and medium high purity aluminum.

DETAILED DESCRIPTION

Referring now to FIG. 1, which is an illustration of a magnetic resonance imaging assembly 10 in accordance with the present invention. It should be understood that the magnetic resonance imaging assembly 10 is intended to be illustrative of a wide variety of assemblies. The magnetic resonance imaging assembly 10 includes a superconducting magnet coil 12 positioned within a substantially cylindrical structure 14 defining a scanning bore 16. An imaging object 18, such as a patient, is placed within the canning bore 16. A cryo-bath 20, such as helium, is utilized to cool the superconducting magnet coil 12 to proper operational temperature. A plurality of shields 22 are also commonly positioned within the cylindrical structure 14.

An RF transmitter 24 is connected to a sequence controller 26 and the primary RF coil 28. The RF transmitter 24 is preferably digitized. The sequence controller 26 controls a series of current pulse generators 30 via a gradient coil controller 32 that is connected to the primary magnetic gradient coil assembly 34. The RF transmitter 24, in conjunction with the sequence controller 26, generates pulses of radio frequency signals for exciting and manipulating magnetic resonance in selected dipoles of a portion of the subject 18 within the scanning bore 16.

A radio frequency receiver 36 is connected with the primary RF coil 28 for demodulating magnetic resonance signals emanating from an examined portion of the subject. An image reconstruction apparatus 38 reconstructs the received magnetic resonance signals into an electronic image representation that is stored in an image memory 40. An image reconstruction device, such as a video processor 42 converts stored electronic images into an appropriate format for display on a video monitor 44.

The cost of cryogen 46 has led to the development and desirability of low cryo boil-off and zero cryo boil-off requirements. In order to facilitate such requirements it is necessary to thermally regulate surrounding structures. FIG. 1 illustrates a first cryocooler assembly 48 mounted to the outer thermal shield 50. The first cryocooler assembly 48 includes a first cold-head sleeve assembly 52, a first coldhead 53 run by a compressor 54. A second cryocooler assembly 56 may be mounted to the second radiation shield 58 as is commonly done in low cryo boil-off systems. The second cryocooler assembly 56' may alternately be mounted to the cryo-bath 20 in order to recondense gas to liquid cryogen 46 in zero boil-off systems. The second cryocooler assembly 56 can include a second cold head sleeve assembly 57, 57', a second cold head 61,61" run by a second compressor 59, 59'.

The present invention improves the thermal contact between a thermal shield, such as the outer thermal shield 50, and the cold head sleeve 52. While a wide variety of coldhead sleeve assemblies are known and contemplated by the present invention, FIG. 3 illustrates one example of a cold head sleeve assembly 52. The cold head sleeve assembly 52 includes a plurality of braid elements 60 connecting a heat bus 62 to a cooler block 64. The braid elements 60 and cooler block 64 are commonly copper. Although the braid elements 60 may be attached in a variety of fashions, one embodiment contemplates electron beam welding the braid elements 60 to the copper block 64. The copper block 64 acts as the thermal path between the outer thermal shield 50 and the cold head sleeve assembly 52. Attaching a copper block 64 to outer thermal shield 50, using known mounting methods can decrease the thermal efficiency and increased the temperature gradient.

The present invention improves upon prior mounting techniques by including a highly thermally conductive block 66 (see FIG. 2). The highly thermally conductive block 66 is welded to the copper block 64 and the outer thermal shield 50. Through the use of welding a more reliable and efficient thermal connection is generated. Although a variety of highly thermally conductive blocks 66 could be utilized, several material properties were desirable. The highly thermally conductive block 66 preferably had a thermal residual resistance ratio (RRR) equal to or greater than the cooler block 64 (in the case of a copper block 64 the RRR=>50). It should be understood that the thermal conductivity is relative to the operating temperature 68 (see FIG. 4) it is measured at. The operating temperature 68 for the present invention is generally less than 50 degrees Kelvin and more particularly between 35-45 degrees Kelvin. It is also desirable that the highly thermally conductive block 66 be easily weld-able to both the copper block 64 as well as the outer thermal shield 50. Furthermore, it was also highly desirable that the thermally conductive block cross-section 70 be approximately twice as big as the cooler block cross-section 72.

With these property preferences in mind, the present invention found high purity aluminum to be suitable for the highly thermally conductive block 66. High purity aluminum (HPA) is intended to encompass a wide variety of purity levels from true high purity aluminum (RRR=approximately 3000) to medium high purity aluminum (RRR=approximately 100). Both HPA and medium HPA were found highly suitable to weld to the copper block 64 as well as outer thermal shield 50. It should be understood that although a particular material was determined to fill the desired properties, other materials may be obvious to one skilled in the art in light of the present disclosure.

While particular embodiments of the invention have been shown and described, numerous variations and alternative embodiments will occur to those skilled in the art. Accordingly, it is intended that the invention be limited only in terms of the appended claims.

The invention claimed is:

1. A magnetic resonance imaging assembly comprising:
   a outer thermal shield having an operational temperature; and
   a cold head sleeve assembly comprising:
   a coldhead sleeve;
   a plurality of braid elements mounted to a cooler block, said plurality of braid elements connecting said coldhead sleeve to said cooler block;
   a highly thermally conductive block mounted between said cooler block and said outer thermal shield, said highly thermally conductive block welded to said outer thermal shield and welded to said cooler block, said highly thermally conductive block having greater thermal conductivity than said outer thermal shield;
   wherein said highly thermally conductive block has a residual resistance ratio of equal to or greater than copper.

2. A magnetic resonance imaging assembly as described in claim 1, wherein said highly thermally conductive block has a residual resistance ratio of 100 within said operational temperature.

3. A magnetic resonance imaging assembly as described in claim 1, wherein said highly thermally conductive block has a residual resistance ratio of 3000 within said operational temperature.

4. A magnetic resonance imaging assembly as described in claim 1, wherein said highly thermally conductive block comprises high purity aluminum.

5. A magnetic resonance imaging assembly as described in claim 1, wherein said highly thermally conductive block comprises a thermally conductive block cross-section, said thermally conductive block cross-section equal to a cooler block cross-section of said cooler block.

6. A magnetic resonance imaging assembly as described in claim 1, wherein said cooler block comprises copper.

7. A magnetic resonance imaging assembly as described in claim 1, wherein said operational temperature is less than 50 degrees Kelvin.

8. A magnetic resonance imaging assembly as described in claim 1, wherein said highly thermally conductive block comprises medium high purity aluminum.

9. A magnetic resonance imaging assembly comprising:
a thermal shield having an operational temperature; and
a cold sleeve assembly comprising:
a coldhead sleeve,
a plurality of braid elements mounted to a cooler block, said plurality of braid element connecting said coldhead sleeve to said cooler block;
a highly purity aluminum block mounted between said cooler block and said thermal shield, said highly purity aluminum block welded to said outer thermal shield and welded to said cooler block, said highly purity aluminum block having greater thermal conductivity than said thermal shield.

10. A magnetic resonance imaging assembly as described in claim 9, wherein said cooler block comprises copper.

11. A magnetic resonance imaging assembly as described in claim 9, wherein said high purity aluminum block has a residual resistance ratio of 100 within said operational temperature.

12. A magnetic resonance imaging assembly as described in claim 9, wherein said high purity aluminum block has a residual resistance ratio of 3000 within said operational temperature.

13. A magnetic resonance imaging assembly as described in claim 9, wherein said high purity aluminum block comprises a thermally conductive block cross-section, said thermally conductive block cross-section equal to a cooler block cross-section of said cooler block.

14. A magnetic resonance imaging assembly as described in claim 9, wherein said operational temperature is less than 50 degrees Kelvin.

15. A method of maintaining an operational temperature of a thermal shield in a magnetic resonance imaging assembly comprising:

generating thermal energy within the thermal shield;
transferring said thermal energy to a cold head assembly comprising:
transferring said thermal energy from the thermal shield into a highly thermally conductive block welded to the thermal shield;
transferring said thermal energy from said highly thermally conductive block into a cooler block within said cold head assembly, said cooler block welded to said highly thermally conductive block; and
picking a material for said highly thermally conductive such that said highly thermally conductive block comprises a residual resistance ration equal to or greater than said cooler block within the operational temperature.

16. A method of maintaining an operational temperature of a thermal shield in a magnetic resonance imaging assembly as described in claim 15, wherein said highly thermally conductive block comprises high purity aluminum.

17. A method of maintaining an operational temperature of a thermal shield in a magnetic resonance imaging assembly as described in claim 15, wherein said highly thermally conductive block comprises medium high purity aluminum.

18. A method of maintaining an operational temperature of a thermal shield in a magnetic resonance imaging assembly as described in claim 15, further comprising:
picking a material for said highly thermally conductive such that said highly thermally conductive block comprises a residual resistance ration equal to or greater than said cooler block within the operational temperature; and
picking said material such that said highly thermally conductive block has a thermally conductive block cross-section equal to a cooler block cross-section of said cooler block.

* * * * *